United States Patent
Caminos et al.

(10) Patent No.: US 6,372,393 B2
(45) Date of Patent: Apr. 16, 2002

(54) PROCESS FOR FABRICATING A PROJECTION ELECTRON LITHOGRAPHY MASK AND A REMOVABLE, REUSABLE COVER FOR USE THEREIN

(75) Inventors: Carlos G. Caminos, Lyndhurst; Chester S. Knurek, Linden; Anthony E. Novembre, Martinsville, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/854,753

(22) Filed: May 15, 2001

Related U.S. Application Data

(62) Division of application No. 09/332,061, filed on Jun. 14, 1999, now Pat. No. 6,251,543.

(51) Int. Cl.$^7$ ................................................ G03F 9/00
(52) U.S. Cl. .......................................... 430/5; 359/511
(58) Field of Search ........................... 430/5, 296, 942; 359/511, 896

*Primary Examiner*—Christopher G. Young

(57) ABSTRACT

A removable, reusable cover constructed such that its geometry matches the geometry of the active region of a projection electron lithography mask to be protected and does not etch in the plasma environment used to remove a photoresist. The cover protects the active region of the projection electron lithography mask, but does not contact the active region. A technique for fabricating a projection electron lithography mask utilizing the removable, reusable cover, where the geometry of the cover is matched to the geometry of an active region of the projection electron lithography mask to be protected. During fabrication of the projection electron lithography mask, the cover protects the active region of the projection electron lithography mask from the plasma environment, but does not contact the active region.

10 Claims, 5 Drawing Sheets

PROCESS FOR FABRICATING A PROJECTION ELECTRON LITHOGRAPHY MASK AND A REMOVABLE, REUSABLE COVER FOR USE THEREIN

This application is a divisional continuation-in-part of co-pending application Ser. No. 09/332,061, U.S. Pat. No. 6,251,543 filed on Jun. 14, 1999, the entire contents of which are hereby incorporated by reference.

BACKGROUND OF THE INVENTION

1. Field of the Invention

The present invention relates to a process for fabricating a projection electron lithography mask and a removable, reusable cover for use therein, and more particularly, to a technique for fabricating a projection electron lithography mask and a removable, reusable cover for use therein, wherein the geometry of the cover is matched to the geometry of an active region (membrane plus strut) of the projection electron lithography mask.

2. Description of the Related Art

Projection electron beam lithography, such as Scattering Angular Limitation Projection Electron Beam Lithography (SCALPEL™), utilizes electron beam radiation projected onto a patterned mask to transfer an image of that pattern into a layer of energy sensitive material formed on a substrate. The image is developed and used in subsequent processing to form devices such as integrated circuits.

The SCALPEL™ mask has a membrane of a low atomic number material on which is formed a layer of high atomic number material. The layer of high atomic number material has a pattern delineated therein. Both the low atomic number membrane material and the high atomic number patterned layer of material are transparent to the electrons projected thereon (i.e., electrons with an energy of about 100 keV). However, the low atomic number membrane materials scatters the electrons weakly and at small angles. The high atomic number patterned layer of material scatters the electrons strongly and at large angles. Thus, the electrons transmitted through the high atomic number patterned material have a larger scattering angle than the electrons transmitted through the membrane. This difference in scattering angle provides a contrast between the electrons transmitted through the membrane alone and the electrons transmitted through the layer of patterned material formed on the membrane.

This contrast is exploited to transfer an image of the pattern from the mask and into a layer of energy sensitive material by using a back focal plane filter in the projection optics between the mask and the layer of energy sensitive material. The back focal plane filter has an aperture therein. The weakly scattered electrons are transmitted through the aperture while the strongly scattered electrons are blocked by the back focal plane filter. Thus, the image of the pattern defined in the weakly scattered electrons is transmitted through the aperture and into the layer of energy sensitive material.

FIG. 1 is a schematic diagram illustrating the concept of a conventional SCALPEL™ system. A beam B of electrons 10 is directed towards a scattering mask 9 including a thin membrane 11 having a thickness between about 1.000 Å and about 20,000 Å (0.1 $\mu$m and about 2 $\mu$m thick.) The membrane 11 is composed of a material which is virtually transparent to the electron beam B composed of electrons 10. That is to say that electrons 10 in beam B pass through membrane 11 freely in the absence of any other object providing an obstruction to the path of electrons 10 in the beam B as they pass from the source of the beam through the membrane 11.

Formed on the side of the membrane 11 facing the beam 10, is a pattern of higher atomic number, higher density scattering elements 12 to provide a contrast mechanism that enables reproduction of the mask pattern at the target surface. The scattering elements 12 are patterned in the composite shape which is to be exposed upon a work piece 17 (usually a silicon wafer) which is coated with e-beam sensitive resist, which as shown in FIG. 1 has been processed into pattern elements 18. The electrons 10 from the e-beam B which pass through the mask 9 are shown by beams 14 which pass through electromagnetic lens 15 which focuses the beams 14 through an aperture 16' into an otherwise opaque back focal plane filter 16. The aperture 16' permits only electrons scattered at small angles to pass through to the work piece 17.

A conventional SCALPEL™ exposure tool is illustrated in FIG. 2. The exposure tool 20 includes a source 22 (usually an electron gun), a mask stage 24, imaging optics 26, and a wafer stage 28. The mask stage 24 and the wafer stage 28 are mounted to the top and bottom of a block of aluminum, referred to as the metrology plate 30. The metrology plate 30, which is on the order of 3000 lbs., serves as a thermal and mechanical stabilizer for the entire exposure tool 20.

FIG. 3 illustrates the conventional mask stage 24, the imaging optics 26, and the wafer stage 28 in more detail. As illustrated in FIG. 3, the source 22 outputs an electron beam, which is aligned and focused on a lens C1 by a gun alignment deflector 40 and a shaping aperture 42. The electron beam is further focused on a lens C2 by a beam blanking deflector 44, an illumination deflector 46, and blanking aperture 48. After passing through lens C2, the electron beam impinges on the mask 9 and is focused on the wafer 17 utilizing lenses P1 and P2 and deflectors P1 and P2 and a SCALPEL™ aperture 50.

The conventional SCALPEL™ mask 9 is formed by a process by which the higher atomic number, higher density scattering elements 12 are formed from a polymeric film (or resist) that is spin-coated on the wafer 17 at selected locations. However, during the spin coating process, resist remains on the wafer 17 at undesired locations.

The unwanted regions are primarily located outside the active region (illustrated as element 60 in FIG. 4). Typically, the unwanted resist covers alignment marks (illustrated as element 62 in FIG. 4) which are patterned during the SCALPEL™ mask blank metal deposition process. The removal of the resist over the marks improves the ability to detect the marks by subsequent exposure of the mask, inspection and metrology tools. In addition to removing the resist from the marks, grounding pads in each corner of the metalized region are exposed so as to allow for a point of contact for grounding the surface during direct write e-beam exposure. Therefore, a method is required to provide for the removal of the resist from the unwanted regions of the SCALPEL™ mask.

It is also desirable to selectively remove the resist from the unwanted regions of the SCALPEL™ mask and still maintain (a) cleanliness, (b) reusability, (c) feasibility in a production-type environment, and (d) add no adverse effects to the imaging resist characteristics (for example, sensitivity, damage, etc.).

The conventional method of removing unwanted resist from the unwanted regions of the SCALPEL™ mask is to use a solvent in a standard radial-type removal. However, this technique is limited to removing resist radially from the edge of the SCALPEL™ mask and hence, the active region of the SCALPEL™ mask must be circular in shape.

Furthermore, the standard method of using a solvent to remove the resist from the edge of the wafer 17 in a radial fashion requires an additional step in the resist coat process, namely the step of dispensing a solvent (usually via a syringe or tube) over the wafer's edge. Its primary purpose is to allow for the removal of excess resist buildup near the edge of the wafer 17. For SCALPEL™ masks with other than circular active regions (such as the rectangular active region 60 of SCALPEL™ mask 9 illustrated in FIG. 4 and 7), it is impossible to uncover alignment marks 62 using the standard method without loss of the resist coating in the active region. FIG. 5 is a photograph showing a loss of resist coverage in an active region on a 100 mm SCALPEL™ mask blank, using wet etch resist removal.

The topology of the alignment marks also is a problem in that the alignment marks are in the form of crosses and it is difficult (sometimes impossible) to remove resist trapped in the intersections of the alignment marks utilizing the standard wet solvent removal process.

SUMMARY OF THE INVENTION

The present invention solves these problems with conventional SCALPEL™ masks and conventional techniques for removing unwanted resist outside of the active region of the SCALPEL™ mask by providing a removable, reusable cover which is constructed such that the geometry of the cover matches the geometry of the active region of a projection electron lithography mask to be protected and does not deteriorate in the plasma etching environment used to remove the resist. In particular, the cover of the present invention protects the active region from the plasma etching environment of the projection electron lithography mask, but does not contact the active region.

The present invention is also directed to a technique for fabricating a projection electron lithography mask utilizing the removable, reusable cover. During fabrication of the projection electron lithography mask, the cover is placed over the active region of the projection electron lithography mask to protect, but not contact, the active region.

DETAILED DESCRIPTION OF THE PREFERRED EMBODIMENTS

The present invention is generally directed to a removable, reusable cover constructed such that its geometry matches the geometry of the active region of a projection electron lithography mask to be protected and does not etch in the plasma environment used to remove the photoresist. In a preferred embodiment, the cover protects the active region of the projection electron lithography mask, but does not contact the active region.

The present invention is also generally directed to a technique for fabricating a projection electron lithography mask utilizing the removable, reusable cover, wherein the geometry of the cover is matched to the geometry of an active region of the projection electron lithography mask to be protected. In a preferred embodiment, during fabrication of the projection electron lithography mask, the cover protects the active region of the projection electron lithography mask from the plasma environment, but does not contact the active region.

Figure 6:
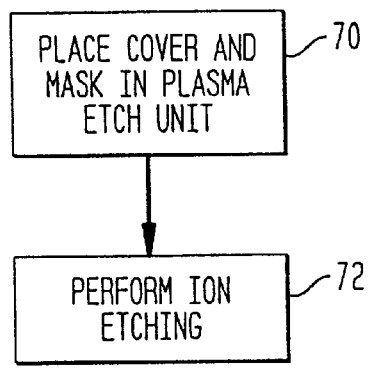
FIG. 6 illustrates a general flowchart for fabricating a projection electron lithography mask.

FIG. 6 illustrates a general flowchart for removing resist from non-active regions of the mask utilizing the removable, reusable cover. First, in step 70, the cover, whose geometry is matched to the geometry of an active region of the projection electron lithography mask to be protected is placed within a plasma etch unit (such as reactive ion etcher or RIE) such that the cover protects the active region of the projection electron lithography mask, but does not contact the active region.

Next, in step 72, the plasma etch process is initiated in the plasma etch unit to remove the unwanted resist outside the active region. In the plasma etch unit, oxygen or suitable etching gas for the resist is brought into a plasma state between two electrodes. The gas and power levels are adjusted to create the desirable etch rate. In the present embodiment, the unwanted resist is removed by dry gaseous plasma.

Given the RIE would remove the entire resist layer if left unprotected, the desired active region is protected by the cover 100. The cover 100 does not etch itself in the gas/plasma environment used to etch the resist.

Figure 7:
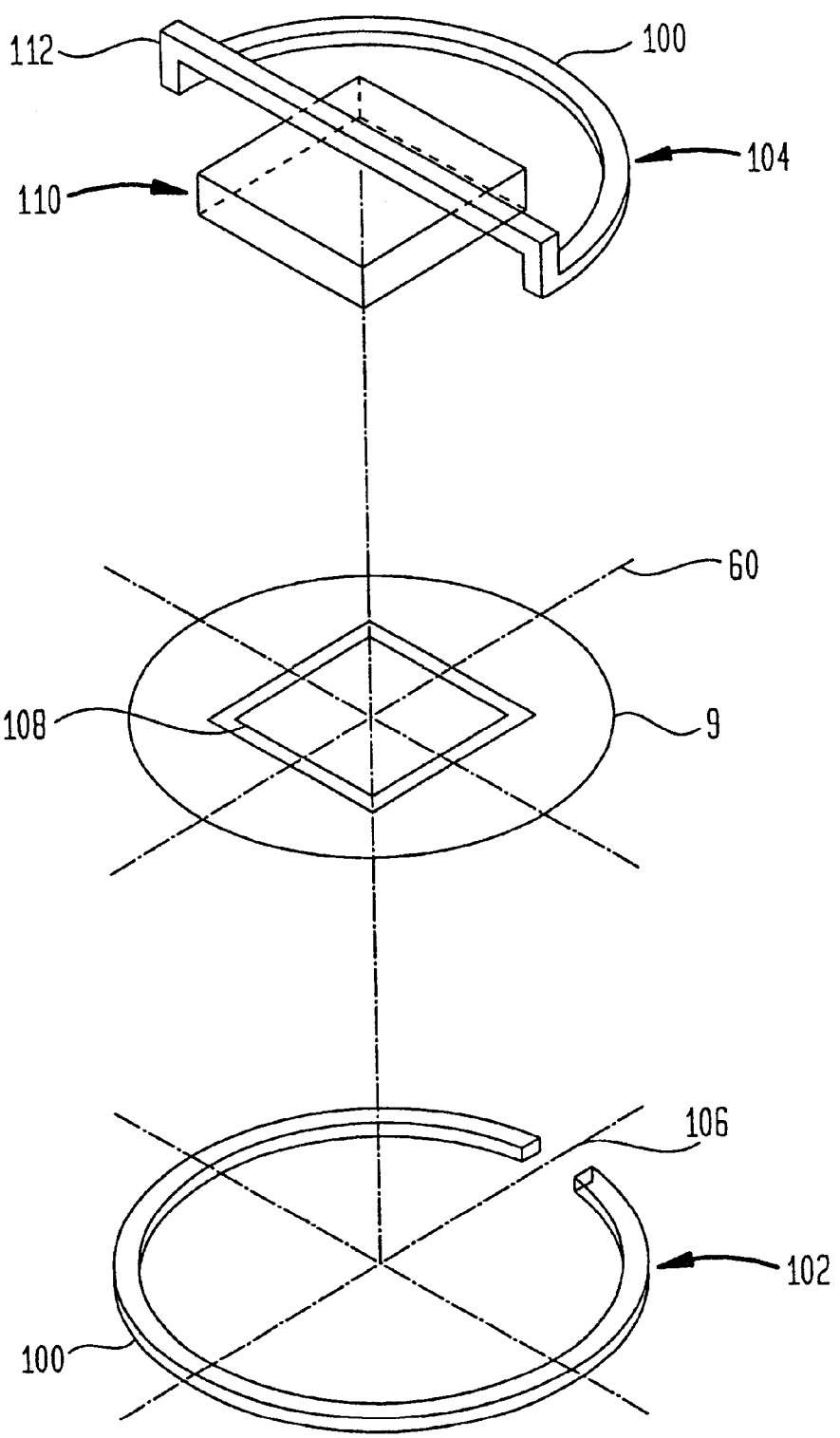
FIG. 7 illustrates the cover of the present invention in a preferred embodiment.

FIG. 7 illustrates a preferred embodiment of the cover 100 of the present invention in more detail. In FIG. 7, the active region of the SCALPEL™ mask 9 is facing upward. As illustrated, the cover 100 includes two parts; a lower member 102, on which the membrane of the SCALPEL™ mask 9 rests, and a upper portion 104 that lies on or above the SCALPEL™ mask 9. The lower member 102 protects the back side surface of the SCALPEL™ mask 9 from direct contact with the RIE. The upper portion 104 protects the active region of the SCALPEL™ mask 9 during the plasma etch step 72.

In one embodiment of the present invention, the lower member 102 contacts only at the perimeter of the surface of the SCALPEL™ mask and has minimal contact with an edge of the SCALPEL™ mask 9 and also provides for a stand-off height to allow for the evacuation of air during the plasma etch step 72.

The membrane 11 of the SCALPEL™ mask 9 is a thin film structure. Trapped air could cause enough turbulence in the evacuation process that would ultimately lead to breakage of the membrane 11. As a result, the lower member 102 includes an air escape passage to allow the air to escape and prevent rupture of the membrane 11.

In a preferred embodiment, the lower member 102 is a support ring with a notch 106 therein, as illustrated in FIG. 7.

Figure 1:
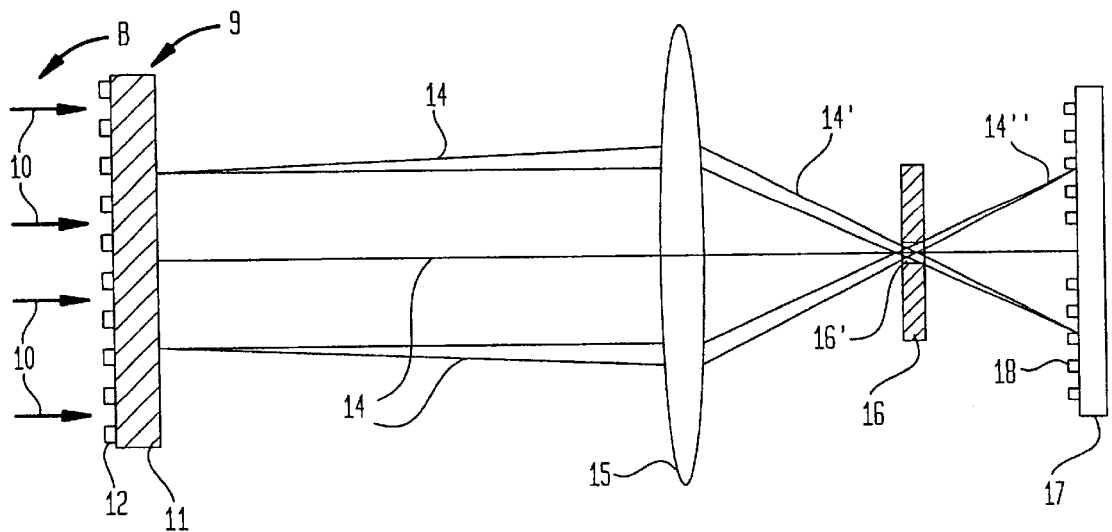
FIG. 1 is a schematic diagram illustrating the concept of a SCALPEL™ system.
Figure 2:
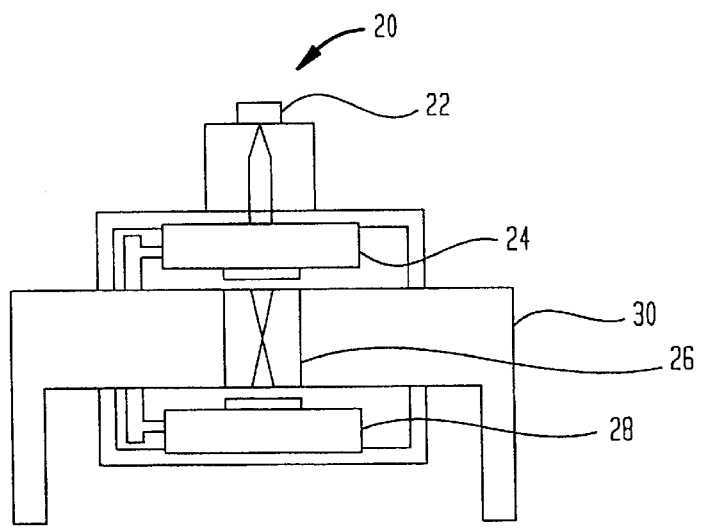
FIG. 2 illustrates a conventional SCALPEL™ exposure tool.
Figure 3:
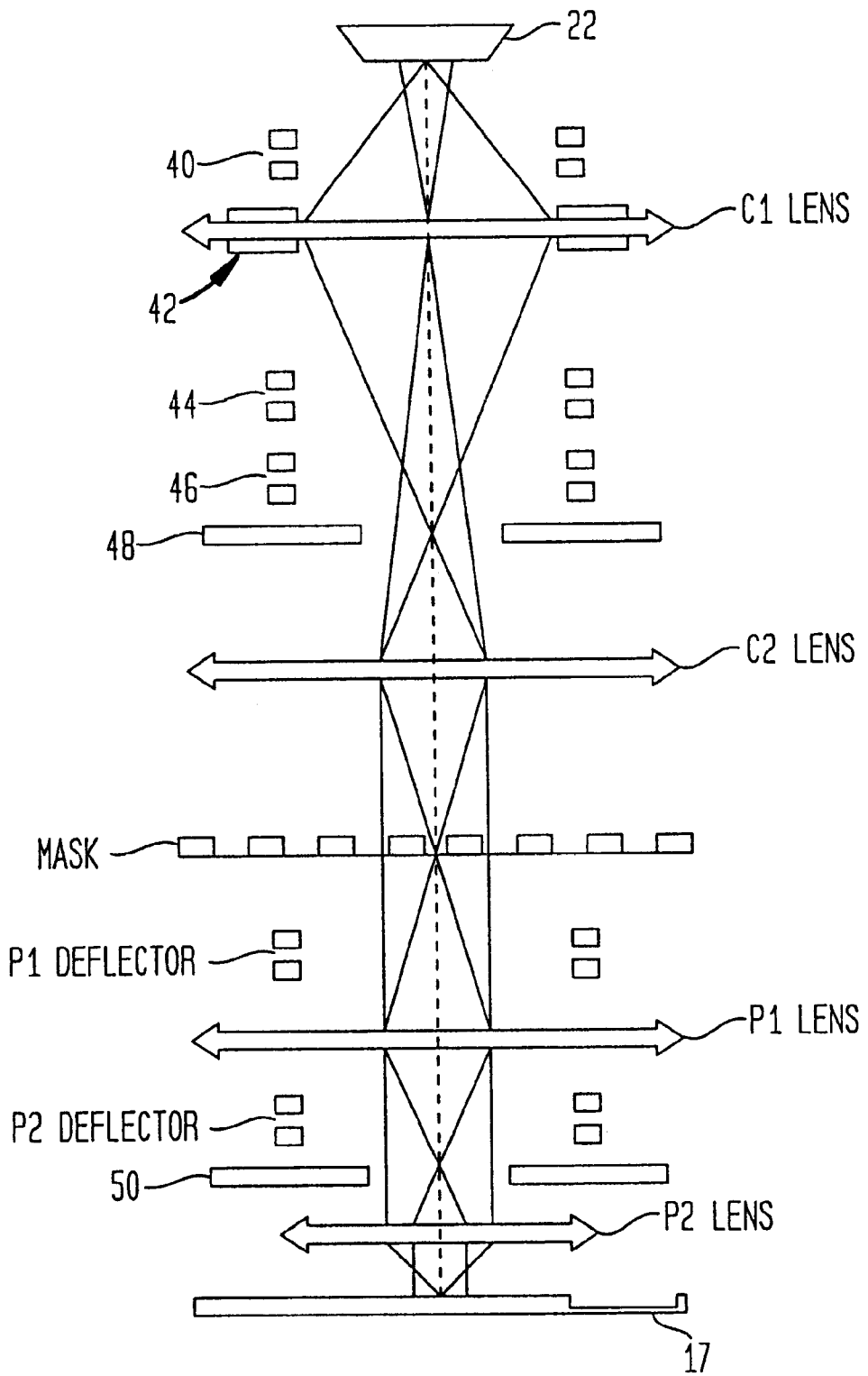
FIG. 3 illustrates portions of the conventional SCALPEL™ exposure tool of FIG. 2 in more detail.
Figure 4:
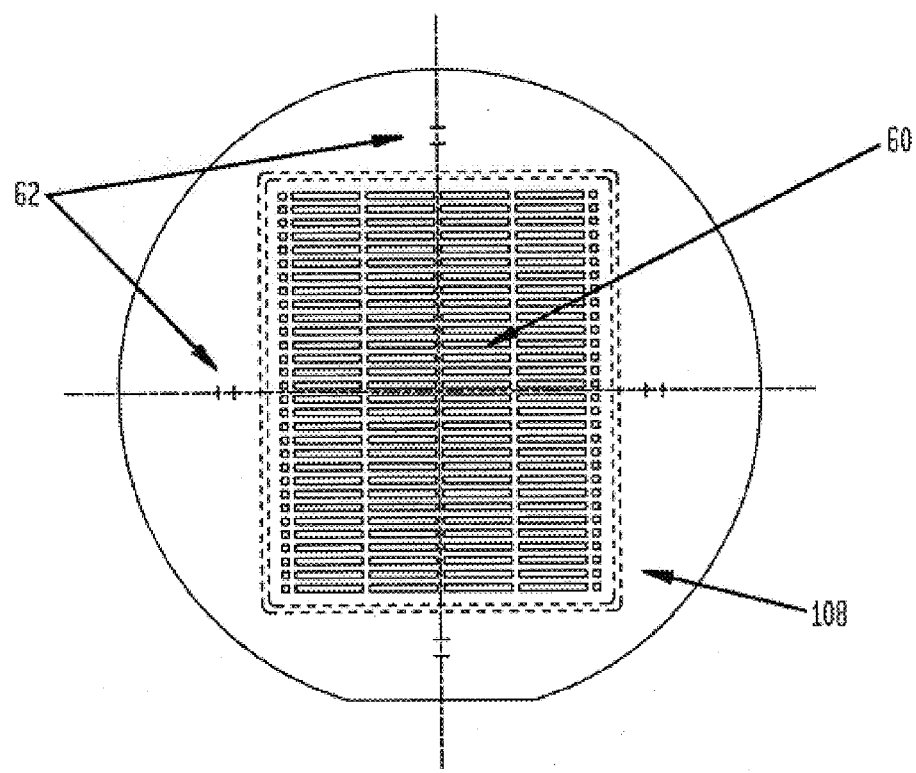
FIG. 4 illustrates a SCALPEL™ mask and wafer in more detail.
Figure 5:
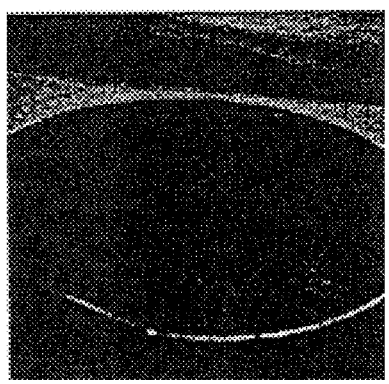
FIG. 5 illustrates a loss of the resist coating in the active region using conventional resist removal techniques.

The upper portion 104 is dimensioned so as to allow maximum protection of the resist coating in the active region of the SCALPEL™ mask 9. The upper portion 104 can be dimensioned to allow for coverage of any shape of active region. The upper portion 104 is vented to allow removal of air during a vacuum pump-down step of the RIE. The upper portion 104 does not contact the active region of the SCALPEL™ mask 9. FIG. 4 and 7 illustrate an outline 108 of the cover 100, which completely covers the active region of the SCALPEL™ mask 9, but does not contact the active region.

In a preferred embodiment, the upper portion 104 includes a rectangular protective portion 110 and a handle 112, as illustrated in FIG. 7. The handle 112 aids in the placement and removal of the upper portion 104 by enabling self-alignment of the cover 100 and the active region 60. The handle 112 further includes a linear portion 114 and a semicircular portion 116 as illustrated in FIG. 7 to further facilitate placement and removal of the cover 100.

In a preferred embodiment, the lower portion 102 and the upper portion 104 are made of any material which is not removed in the plasma etching environment used to etch the resist. In a preferred embodiment the material is aluminum because aluminum is not easily oxidized. In another preferred embodiment, the lower portion 102 and the upper portion 104 are made of Ultum which is a material compatible with the oxygen etch process.

Figure 9:
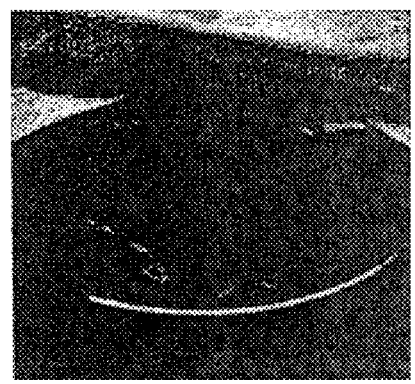
FIG. 9 illustrates the result of the process of FIG. 8.
Figure 8:
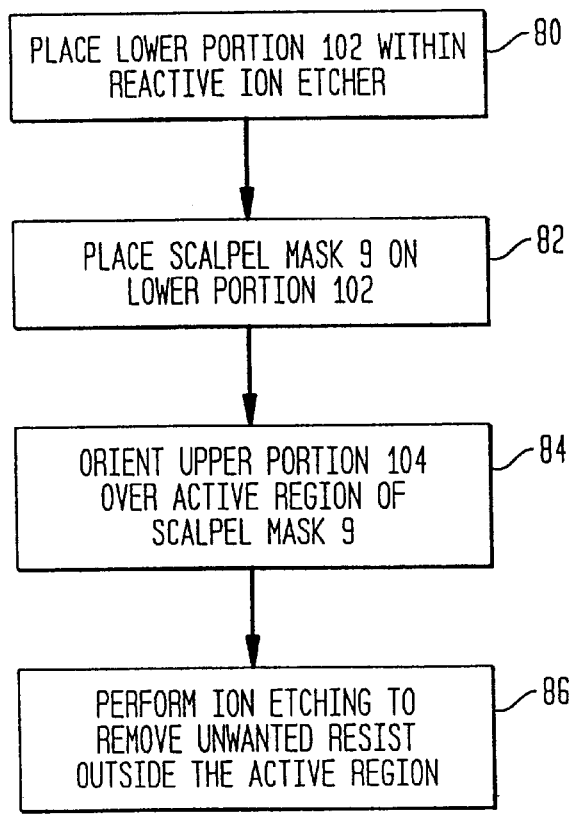
FIG. 8 illustrates the process for fabricating a projection electron lithography mask of the present invention in a preferred embodiment.

FIG. 8 illustrates a preferred embodiment of the process for fabricating a projection electron lithography mask such as the SCALPEL™ mask illustrated in FIG. 7, of the present invention in more detail. First, in step 80, the lower portion 102 is placed within the reactive ion etcher. Then, in step 82, the SCALPELT™ mask 9 is placed onto the lower portion 102. Next, in step 84, the upper portion 104 is oriented over the active region of the SCALPEL™ mask 9. Finally, in step 86, the plasma etch process is initiated to remove the unwanted resist outside the active region. The end result of the fabrication process is illustrated in FIG. 9, which shows complete resist coverage of the active region on a 100 mm SCALPEL™ mask blank, using dry etch resist removal.

The preferred embodiment of the present invention illustrated in FIG. 7 specifically describes a rectangular active region 60 and a rectangular shape cover 100. However, the invention of the present application should not be limited to such a structure. In particular, one aspect of the present invention is that the geometry of the protective portion 110 of the cover 100 should be matched the geometry of the active region 60 of the SCALPEL™ mask to be protected. It is another aspect of the present invention that the cover is not etched in the plasma environment used to remove the photoresist. This means that the cover will protect the action region 60 and also be reusable for other active regions of the same or similar shape. Another aspect of the present invention is that the protective portion 110 contacts the SCALPEL™ mask 9 at a perimeter of the protective portion 110, but does not contact the active region 60.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for fabricating a projection electron lithography mask, comprising:

placing the projection electron lithography mask and a removable, reusable cover in a plasma etch environment, wherein a geometry of the cover substantially matches a geometry of an active region of the projection electron lithography mask, such that the cover protects the active region, but does not contact the active region; and etching the projection electron lithography mask to remove resist outside the active region, wherein the cover is made of a material that is not substantially removed during etching.

2. The process of claim 1, wherein the projection electron lithography mask is a SCALPEL™ mask.

3. The process of claim 1, wherein the cover is made of aluminum or ultum.

4. The process of claim 1, wherein the cover permits air escape to prevent rupture of the projection electron lithography mask.

5. The process of claim 1, wherein said etching step utilizes dry gaseous plasma.

6. The process of claim 1, wherein said etching step removes resist from alignment marks in the projection electron lithography mask.

7. The process of claim 1, wherein the cover includes an upper portion and a lower portion, wherein the lower portion is placed, below the projection electron lithography mask and the upper portion is placed above the projection electron lithography mask.

8. The process of claim 7, wherein the upper portion includes a handle for facilitating placement and alignment of the upper portion, the lower portion and the projection electron lithography mask and a protective portion that protects the active region of the projection electron lithography mask.

9. The process of claim 8, wherein the protective portion includes a edge which contacts an outline on the projection electron lithography mask, wherein the edge is the only area of the upper portion to contact the projection electron lithography mask.

10. The process of claim 8, wherein the lower portion and the handle are shaped to facilitate placement and alignment of the upper portion, the lower portion and the projection electron lithography mask.

* * * * *